United States Patent
Tu et al.

(10) Patent No.: US 6,720,232 B1
(45) Date of Patent: Apr. 13, 2004

(54) METHOD OF FABRICATING AN EMBEDDED DRAM FOR METAL-INSULATOR-METAL (MIM) CAPACITOR STRUCTURE

(75) Inventors: Kuo-Chi Tu, Hsinchu (TW); Chun-Yao Chen, Hsinchu (TW); Huey-Chi Chu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/411,347

(22) Filed: Apr. 10, 2003

(51) Int. Cl.$^7$ .......................... H01L 21/20; H01L 27/108
(52) U.S. Cl. ...................... 438/396; 438/239; 438/253; 257/296; 257/306
(58) Field of Search ................. 438/239, 243, 438/253, 255, 396, 397, 398; 257/296, 300, 301, 303, 306, 307

(56) References Cited

U.S. PATENT DOCUMENTS

| | | | |
|---|---|---|---|
| 6,096,597 A | 8/2000 | Tsu et al. ................ | 438/240 |
| 6,207,579 B1 * | 3/2001 | Chen .......................... | 438/706 |
| 6,211,061 B1 | 4/2001 | Chen et al. ................ | 438/622 |
| 6,271,084 B1 | 8/2001 | Tu et al. ..................... | 438/253 |
| 6,271,555 B1 * | 8/2001 | Hakey et al. ............... | 257/301 |
| 6,329,234 B1 | 12/2001 | Ma et al. ................... | 438/210 |
| 6,429,476 B2 * | 8/2002 | Suzuki et al. ............... | 257/296 |
| 6,472,266 B1 * | 10/2002 | Yu et al. ..................... | 438/396 |
| 6,602,749 B2 * | 8/2003 | Tu et al. ..................... | 257/296 |
| 6,642,097 B2 * | 11/2003 | Tu ............................... | 438/241 |

* cited by examiner

*Primary Examiner*—Kevin M. Picardat
(74) *Attorney, Agent, or Firm*—George O. Saile; Stephen B. Ackerman; Rosemary L. S. Pike

(57) ABSTRACT

A method for fabricating a metal-insulator-metal capacitor in an embedded DRAM process is described. A plurality of contact plugs are provided through an insulating layer to semiconductor device structures in a substrate wherein the contact plugs are formed in a logic area of the substrate and in a memory area of the substrate and providing node contact plugs to node contact regions within the substrate in the memory area. Thereafter, capacitors are fabricated in a twisted trench in a self-aligned copper process.

33 Claims, 17 Drawing Sheets

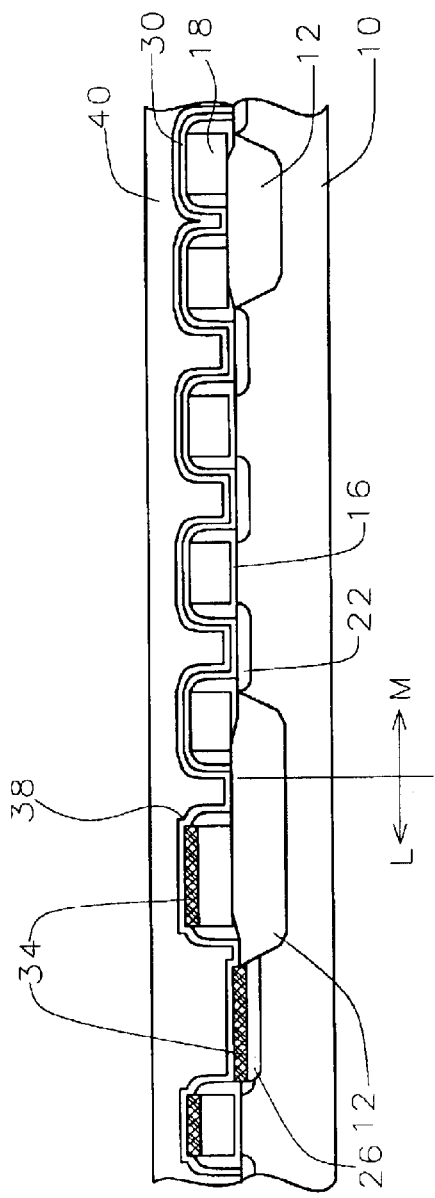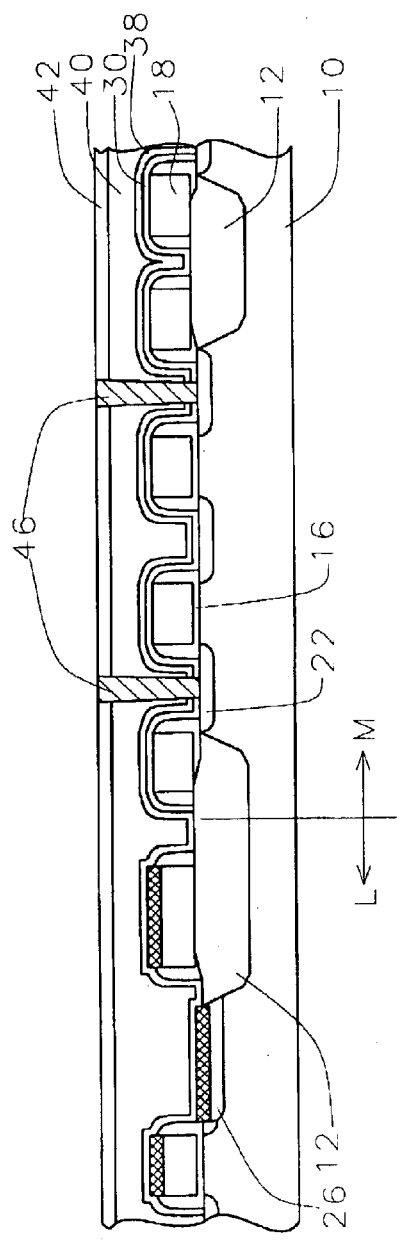

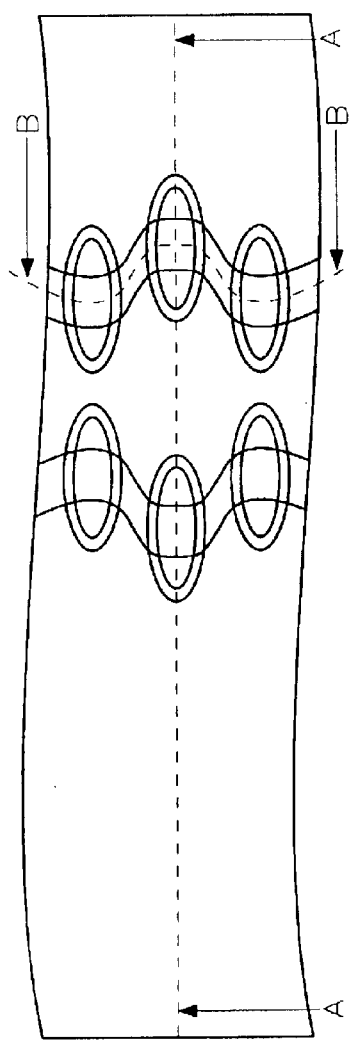
FIG. 16
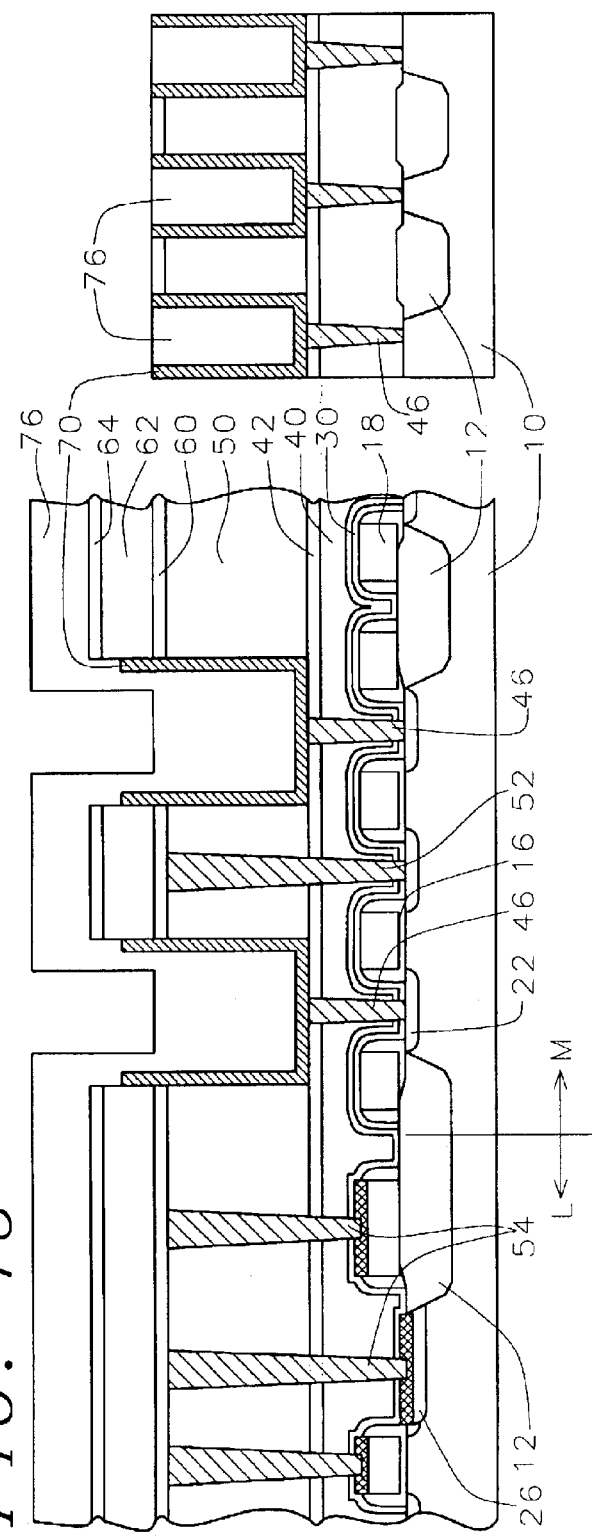
FIG. 17A
FIG. 17B

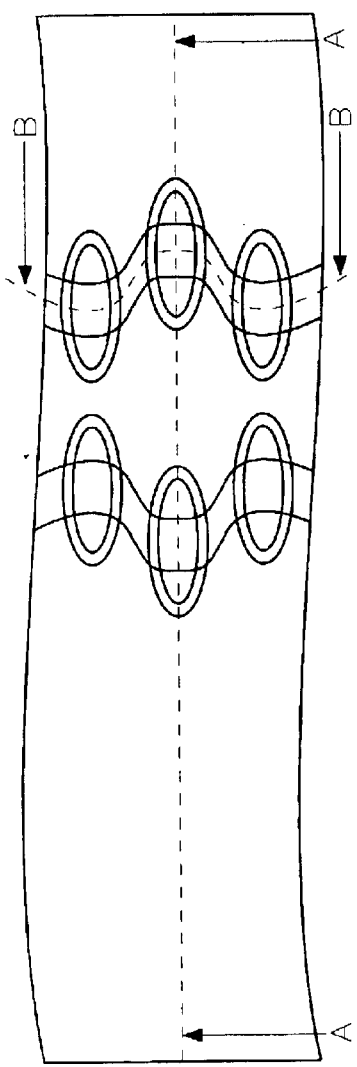
FIG. 18
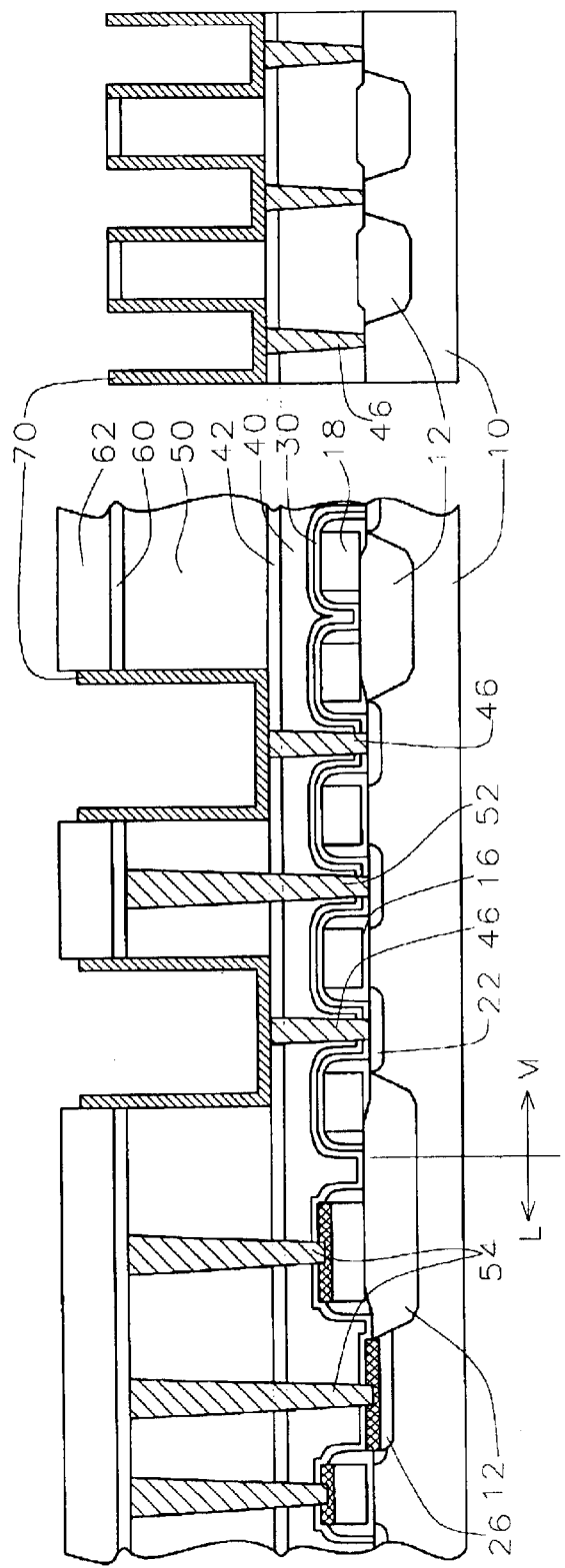
FIG. 19A
FIG. 19B

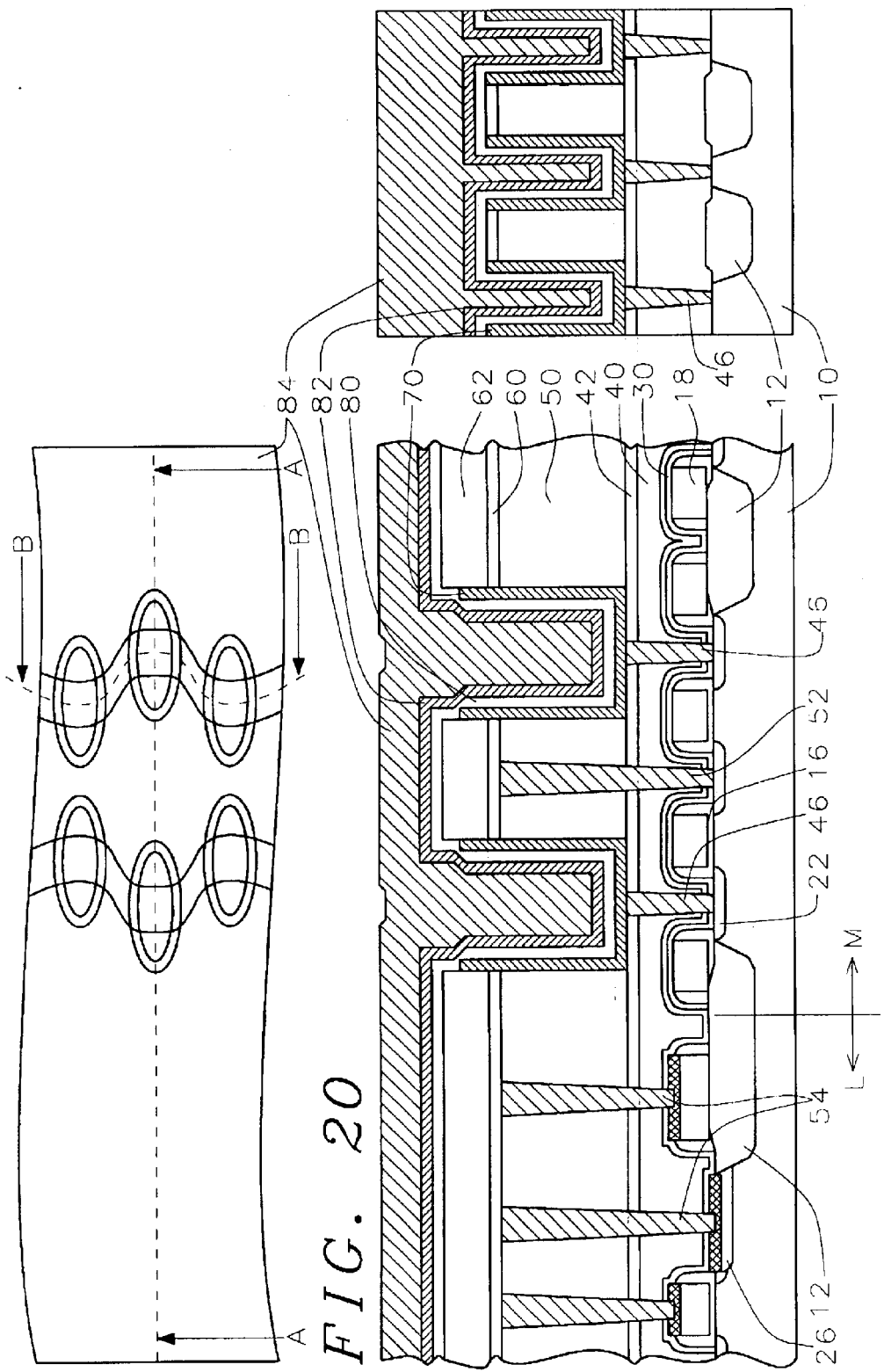

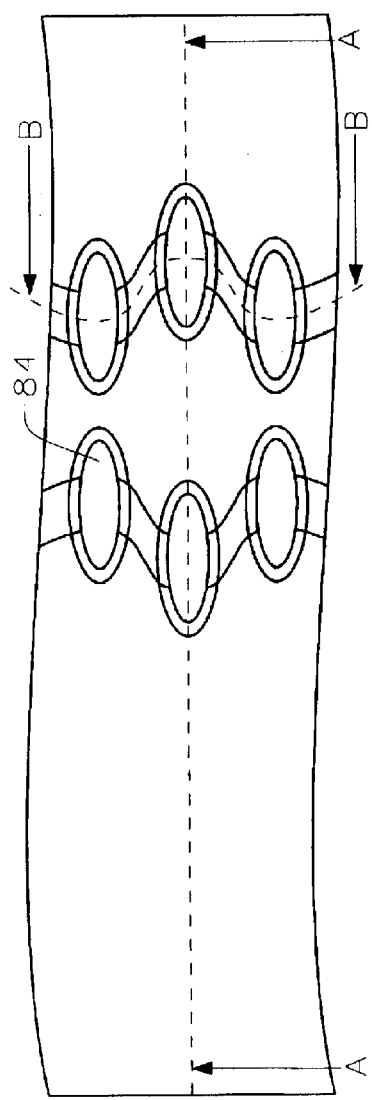
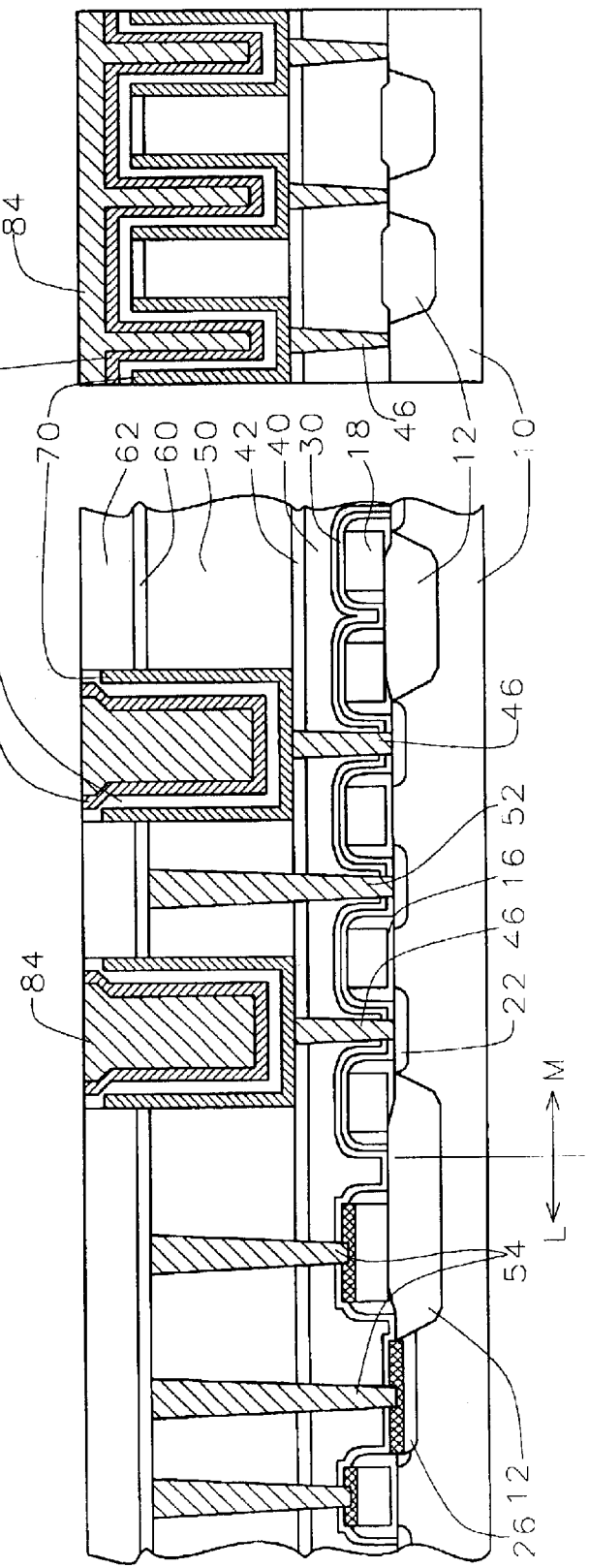
FIG. 22
FIG. 23A
FIG. 23B

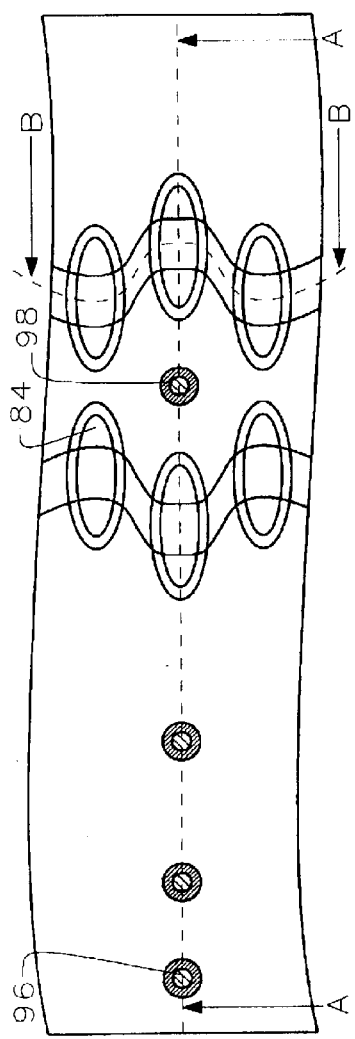
FIG. 26
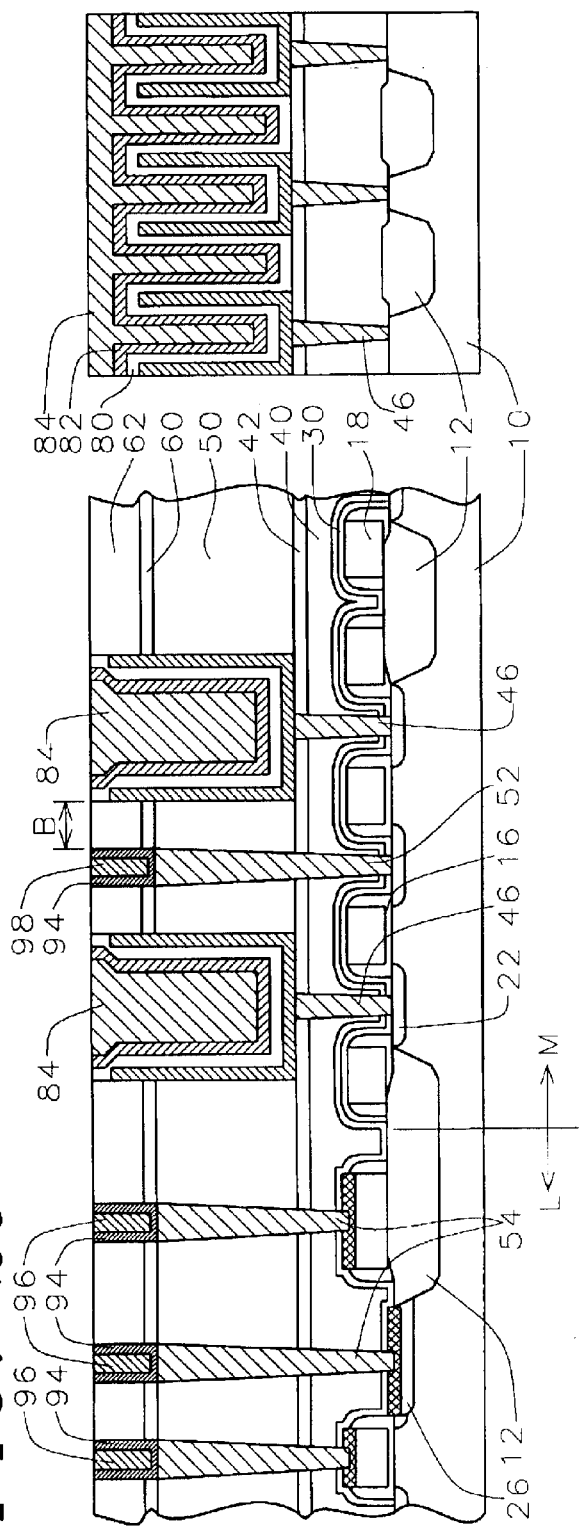
FIG. 27A
FIG. 27B

METHOD OF FABRICATING AN EMBEDDED DRAM FOR METAL-INSULATOR-METAL (MIM) CAPACITOR STRUCTURE

BACKGROUND OF THE INVENTION (1) Field of the Invention

The present invention relates to methods of fabricating a metal-insulator-metal capacitor, and more particularly, to methods of forming metal-insulator-metal capacitors for embedded DRAM applications wherein contact etch depth is reduced in the fabrication of an integrated circuit device.

(2) Description of the Prior Art

In merging logic circuits and dynamic random access memory (DRAM) arrays on a single chip, compatibility is the primary issue with respect to both design and fabrication. Recently, with the continued decrease in device dimensions, it has become increasingly important to find solutions to problems that are caused by etching high aspect ratio contact openings. The DRAM capacitor's height must be increased in order to meet the high capacitance requirement. Meanwhile, in order to achieve a high dielectric constant for a metal-insulator-metal (MIM) or metal-insulator-silicon (MIS) capacitor, the dielectric material should be deposited at high temperature (of more than about 600° C.) or annealed at high temperature after film deposition. Thus, the capacitor formation must be completed before the copper/low dielectric constant (k) material process. But this limitation will impact contact etching because of device dimension shrinkage. Because of the high capacitance requirement, the height of the capacitor cannot be reduced. However, we can try to improve the contact high aspect ratio etch problem in other ways. U.S. Pat. Nos. 6,096,597 to Tsu et al, 6,329,234B1 to Ma et al, and 6,271,084B1 to Tu et al show MIM capacitor processes. U.S. Pat. No. 6,211,061 to Chen et al teaches a dual damascene process with carbon-based low-k materials.

SUMMARY OF THE INVENTION

Accordingly, it is a primary object of the invention to provide an effective and very manufacturable process for producing a metal-insulator-metal capacitor in an embedded DRAM process.

Another object of the present invention is to provide al method for fabricating a metal-insulator-metal capacitor in an embedded DRAM process with reduced contact etch depth.

In accordance with the objects of this invention, a method for fabricating a metal-insulator-metal capacitor, in an embedded DRAM process is achieved. A plurality of contact plugs are provided through an insulating layer to semiconductor device structures in a substrate wherein the contact plugs are formed in a logic area of the substrate and in a memory area of the substrate and providing node contact plugs to node contact regions within the substrate in the memory area. Thereafter, capacitors are fabricated in a twisted trench in a self-aligned copper process.

Also in accordance with the objects of this invention, a method for fabricating a metal-insulator-metal capacitor in an embedded DRAM process is achieved. A plurality of contact plugs are provided through an insulating layer to semiconductor device structures in a substrate wherein the contact plugs are formed in a logic area of the substrate and in a memory area of the substrate and providing node contact plugs to node contact regions within the substrate in the memory area. Thereafter, capacitors are fabricated in two twisted trench in a self-aligned copper process. The two twisted trenches are mirror images of each other wherein each capacitor in a first of the two twisted trenches is horizontally aligned with a capacitor in the second of the two twisted trenches to form pairs of capacitors wherein the pairs of capacitors are separated from each other horizontally by a first or a second distance wherein the first distance is greater than the second distance. The capacitors are formed by the following process. A silicon carbide layer is deposited overlying the contact plugs. A low dielectric constant material layer is deposited overlying the silicon carbide layer. A stop layer is deposited overlying the low dielectric constant material layer. A first opening is formed through the stop layer, the low dielectric constant material layer, the silicon carbide layer, and the insulating layer to the node contact plug. A first metal layer is deposited overlying the stop layer and within the first opening. The first opening is filled with a sacrificial layer which is etched back to leave the first metal layer only within the first opening and recessed from the top of the first opening wherein the first metal layer forms a bottom electrode of the capacitor. Thereafter, the sacrificial layer and the stop layer are removed. A twisted trench is formed. A capacitor dielectric layer is deposited overlying the bottom electrode. A second metal layer is deposited overlying the capacitor dielectric layer. A third metal layer is deposited overlying the second metal layer and filling the first opening. The third metal layer, the second metal layer, and the capacitor dielectric layer are polished back to leave these layers only within the first opening wherein the second and third metal layers together form a top electrode of the capacitor. Second openings are etched through the low dielectric constant layer and the silicon carbide layer to the contact plugs. The second opening in the memory area lies between the two twisted trenches and in a horizontal line with one capacitor pair having the first separation distance wherein adjacent capacitor pairs have the second separation distance. The second openings are filled with a fourth metal layer to complete contacts to the contact plugs in the logic area and in the memory area.

Also in accordance with the objects of the invention, an improved embedded DRAM and capacitor structure device is achieved. Trenched capacitors are formed in two twisted trenches through an insulating layer in a memory area of an integrated circuit wherein the two twisted trenches are mirror images of each other and wherein each capacitor in a first of the two twisted trenches is horizontally aligned with a capacitor in a second of the two twisted trenches to form pairs of capacitors wherein the pairs of capacitors are separated from each other horizontally by a first or a second distance wherein the first distance is greater than the second distance. A bit line contact in the memory area through the insulating layer to a bit line lies between the two twisted trenches and in a horizontal line with one capacitor pair having the first separation distance wherein adjacent capacitor pairs have the second separation distance. First line metal contacts are formed in a logic area of the integrated circuit. The bit line contact and the first line metal contacts are no higher vertically than the trenched capacitors.

BRIEF DESCRIPTION OF THE DRAWINGS

In the following drawings forming a material part of this description, there is shown:

FIGS. 2 through 13, 15A, 15B, 17A, 17B, 19A, 19B, 21A, 21B, 23A, 23B, 24, and 25 are schematic cross-sectional representations of a first preferred embodiment of the present invention.

FIGS. 14, 16, 18, 20, and 22 are top views of a first preferred embodiment of the present invention.

FIG. 26 is a top view of a second preferred embodiment of the present invention.

FIGS. 27A and 27B are schematic cross-sectional representations of a second preferred embodiment of the present invention.

DESCRIPTION OF THE PREFERRED EMBODIMENTS

The process of the present invention provides methods for fabricating a metal-insulator-metal (MIM) capacitor in an embedded DRAM process wherein the contact etch is improved.

Figure 2:
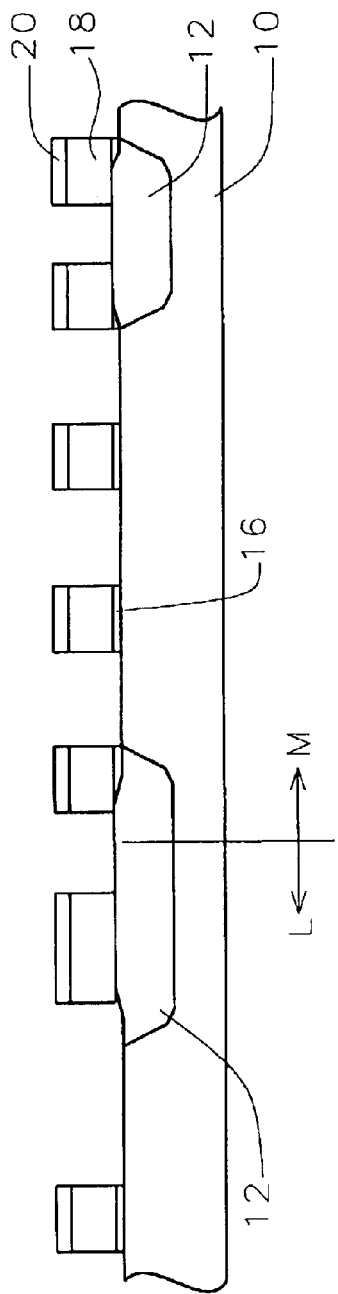

Referring now more particularly to FIG. 2, there is shown a partially completed integrated circuit device. The semiconductor substrate 10 is preferably composed of silicon having a (100) crystallographic orientation. Semiconductor device structures are formed in and on the semiconductor substrate. For example, isolation regions such as shallow trench isolation (STI) 12 are formed in the semiconductor substrate to separate active areas. A gate oxide layer 16 is grown or deposited on the substrate surface. A polysilicon layer 18 is deposited over the gate oxide layer, followed by a hard mask layer of silicon oxynitride (SiON) 20, for example. The SiON, polysilicon, and gate oxide layers are patterned to form gate electrodes, as shown in FIG. 2, in both the logic area L and the memory area M.

Figure 3:
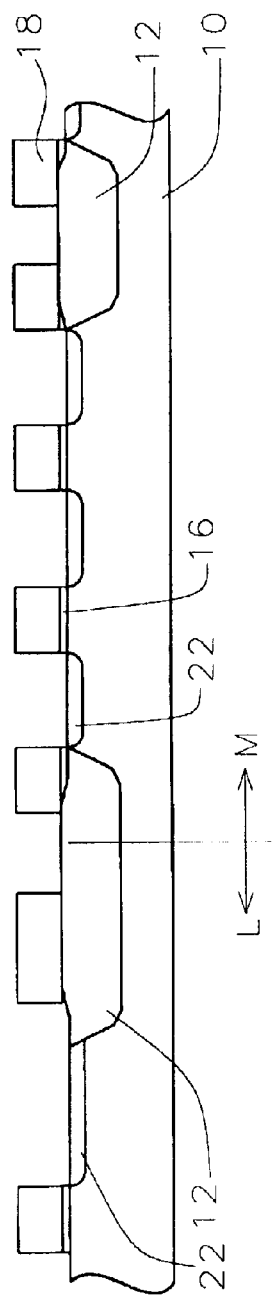
Figure 4:
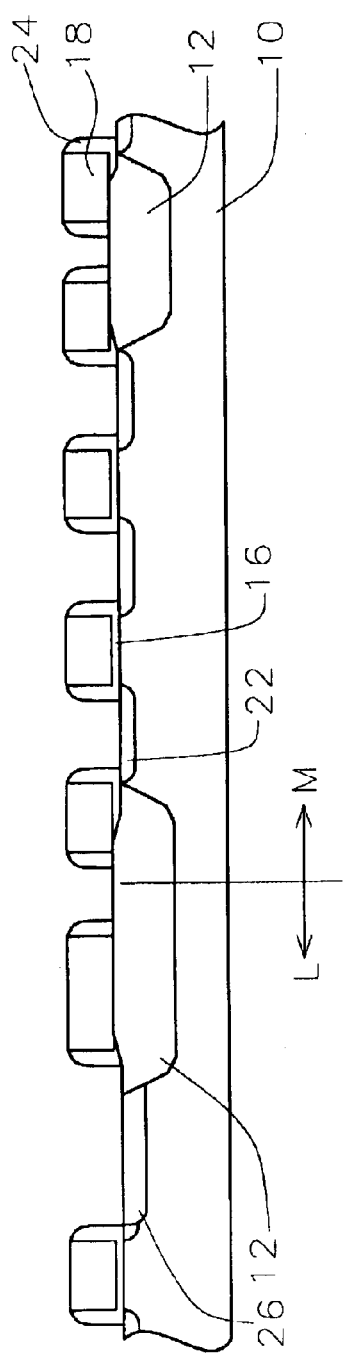

Now, as shown in FIG. 3, the hard mask layer is stripped and lightly doped source and drain regions 22 are formed, for example, by ion implantation. Spacers 24 are formed on the sidewalls of the gate electrodes 18 and used as a mask for implanting source/drain regions 26 in the logic area L, as shown in FIG. 4.

Figure 5:
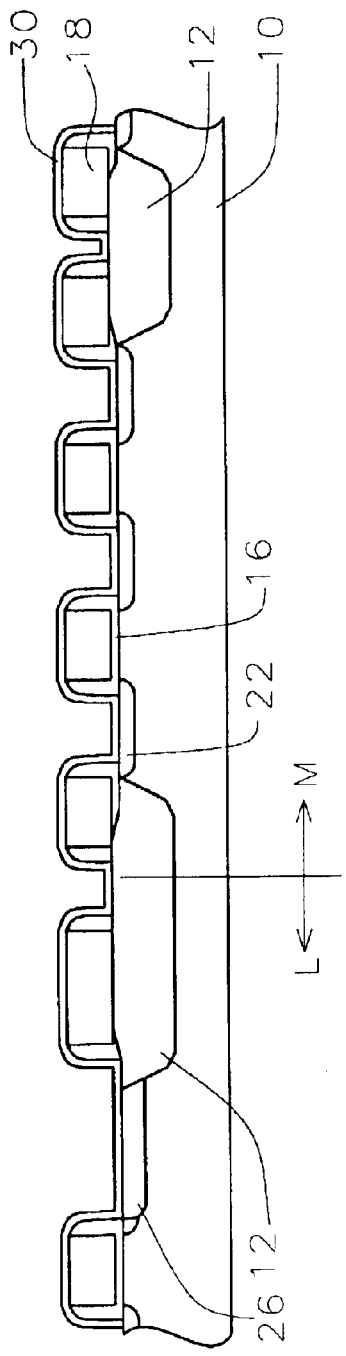
Figure 6:
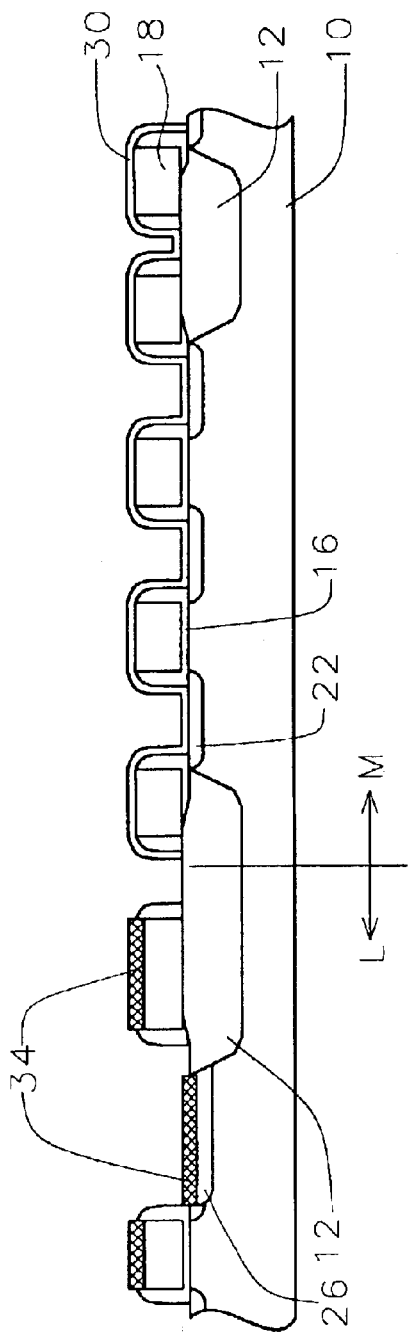

Referring now to FIG. 5, a layer of resist protective oxide (RPO) 30 is conformally deposited over the surface of the substrate. The RPO layer 30 will protect the DRAM area from salicidation. As illustrated in FIG. 6, the RPO layer is removed in the logic area L. Silicide 34 is formed on the gates and source/drain regions in the logic area by a self-aligned salicide process.

Figure 7:
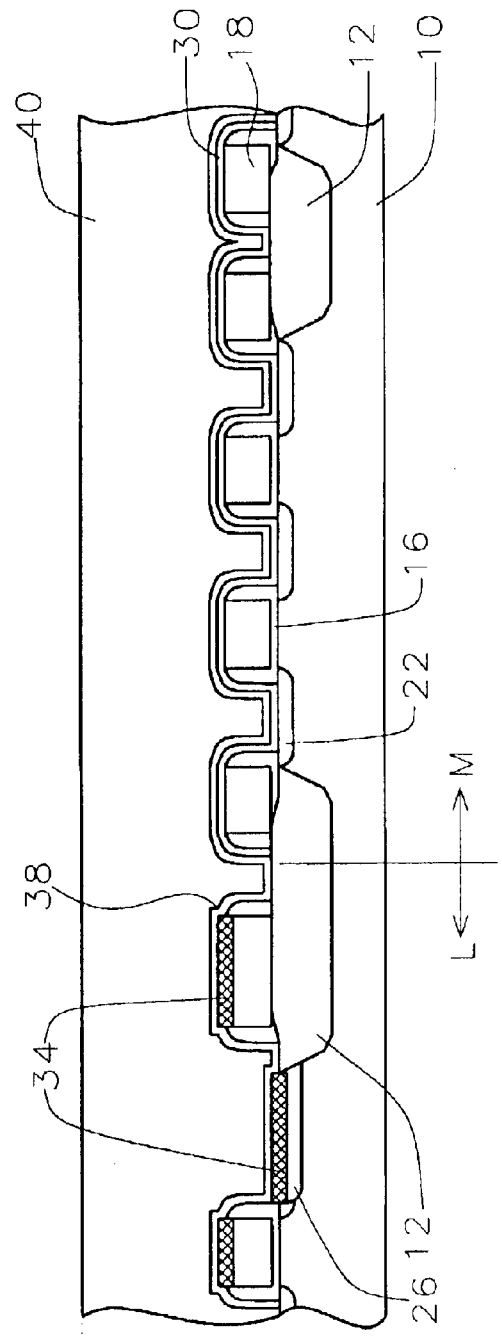

Now, an insulating layer is to be formed over the device structures. For example, as shown in FIG. 7, a first conformal layer of silicon oxynitride 38 is deposited over the device structures. Then a thick insulating layer 40, such as chemically vapor deposited (CVD) silicon dioxide, phosphosilicate glass (PSG), high density plasma oxide, or the like, is deposited over the gate electrodes 18 and then planarized, for example by chemical mechanical polishing (CMP), to obtain a flat surface. The insulating layer 40 should have a thickness of about 3000 Angstroms over the gate electrodes after CMP.

Referring now to FIG. 8, the thickness of the insulating layer 40 over the gate electrodes is further reduced to be between about 600 and 1400 Angstroms. For example, this may be done by a plasma dry etch back process that is carefully controlled using a time mode etching recipe dependent upon the variation thickness of the CMP step.

Next, a stop layer 42 is deposited over the insulating layer 40. For example, the stop layer 42 may comprise silicon oxynitride or silicon nitride and have a thickness of between about 300 and 1000 Angstroms. As illustrated in FIG. 9, contact openings are etched through the stop layer 42 and the insulating layers 40, 38, and 30 to the regions 22 that will form the DRAM cell storage nodes. The contact openings are lined with a barrier layer, not shown, which may be titanium and titanium nitride, for example, then filled with a tungsten layer. The tungsten layer is planarized using CMP, for example, to leave tungsten plugs 46.

Figure 10:
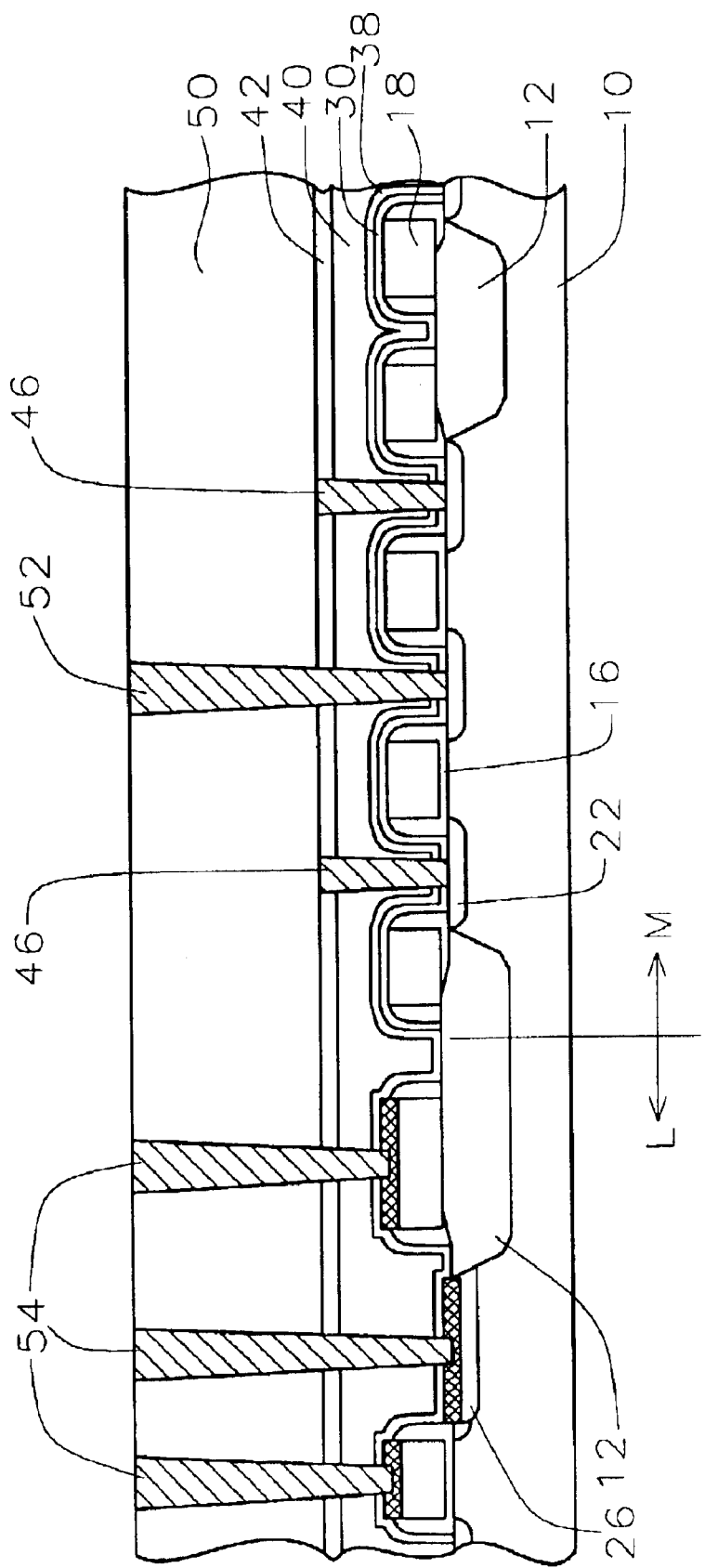

Referring now to FIG. 10, a second insulating layer 50 is deposited over the tungsten plugs. This insulating layer may have a thickness of between about 5000 and 15,000 Angstroms. Contact openings are made through the second oxide layer 50, the stop layer 42, and the underlying insulating layers to provide a bit line contact 52 in the memory area M and first metal line contacts 54 in the logic area L. The contact openings are lined with a barrier layer, not shown, which may be titanium and titanium nitride, for example, then filled with a tungsten layer. The tungsten layer is planarized using CMP, for example, to leave tungsten plugs 52 and 54. These contacts are a key feature of the present Invention. In the prior art, the contacts are usually opened after the capacitor's formation. However, in the process of the present invention, the contacts are opened prior to formation of the capacitor. Because of this fact, the contact height is reduced. For example, if a 25 fF/cell capacitance is needed, the prior art requires a capacitor height of about 15,000 Angstroms. However, the capacitor of the present invention requires a height of only 12,000 Angstroms while attaining the same capacitance. This great improvement in contact depth is achieved through the unique process and layout of the present invention.

Figure 11:
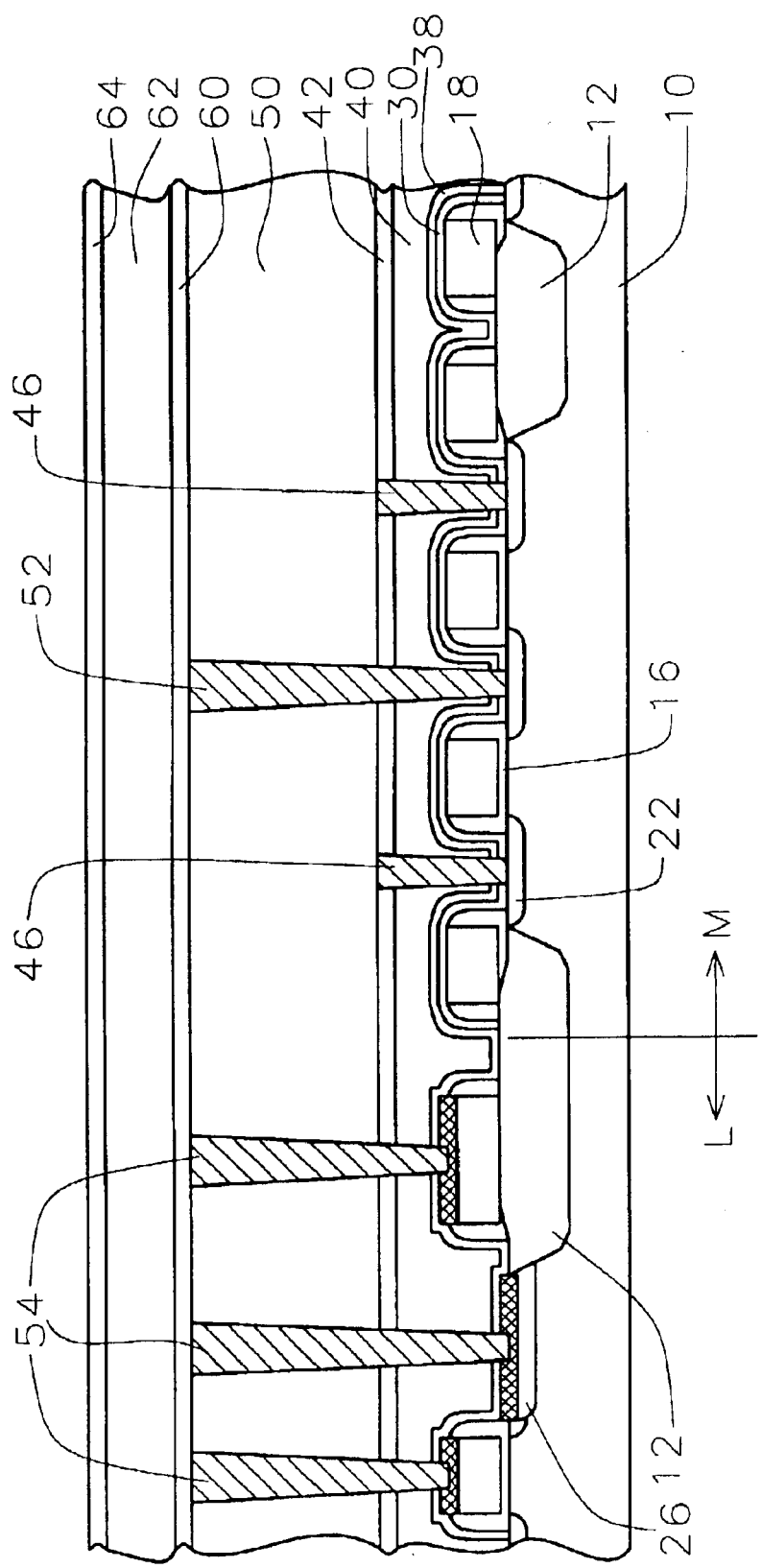

As illustrated in FIG. 11, a stop layer 60 is deposited over the tungsten plugs 52 and 54 to a thickness of between about 300 and 700 Angstroms. This layer may be silicon nitride or silicon carbide. Now, a low-k material layer 62 is deposited over the SiC layer 60. The low-k material layer may comprise fluorinated silicate glass or undoped silicate glass, for example, and have a thickness of between about 1000 and 5000 Angstroms. A SiON layer 64 is deposited to a thickness of between about 200 and 600 Angstroms, overlying the low-k material layer 62.

Figure 12:
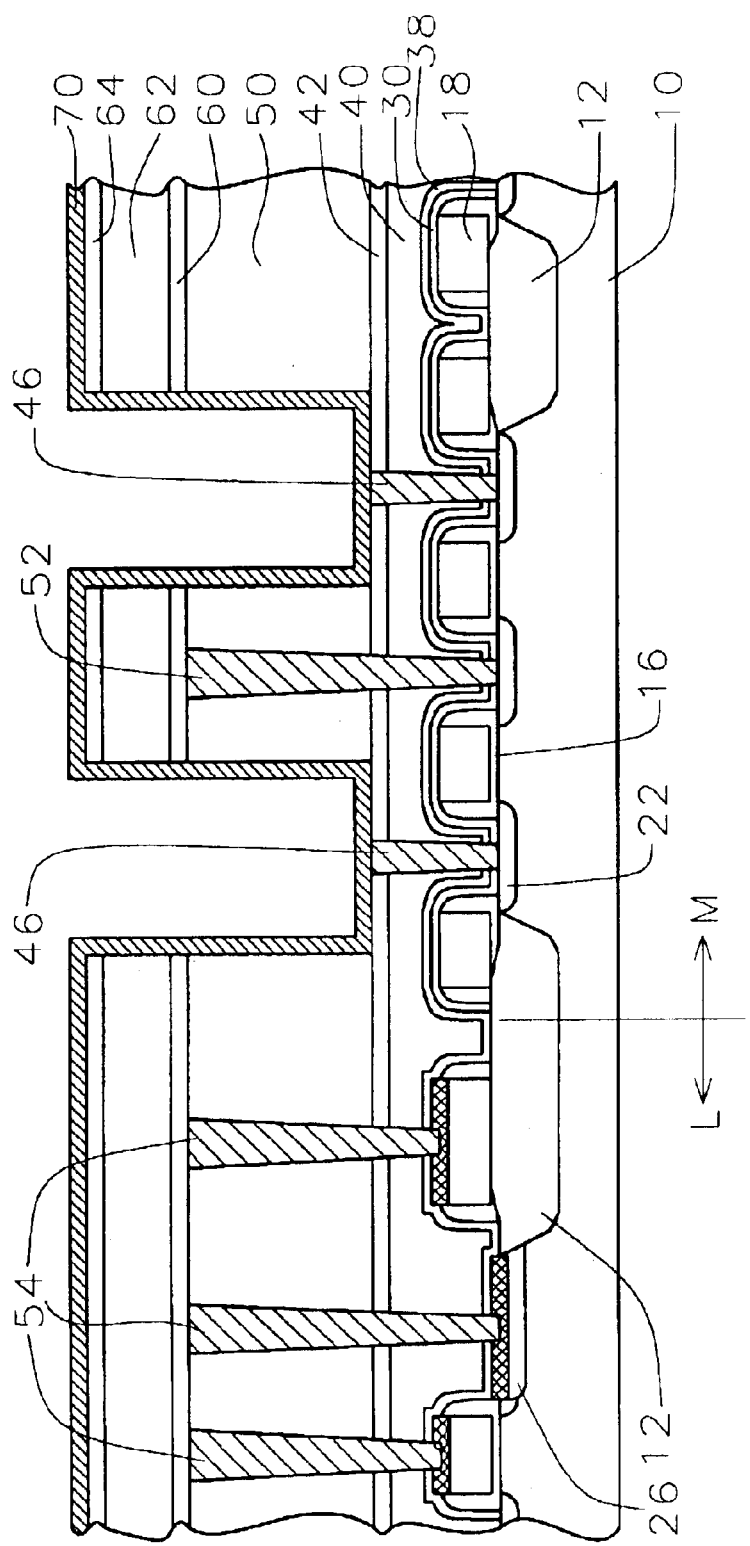

Referring now to FIG. 12, openings are etched in the memory area into the dielectric layers with an etch stop at the SiON or SiN layer 42. These openings will form the storage nodes of the capacitor structures of the present invention. Now, a layer such as tantalum nitride or titanium nitride 70 is deposited conformally over the SiON layer 64 and within the storage node openings. The TaN or TiN layer will form the bottom electrode of the capacitor.

Figure 13:
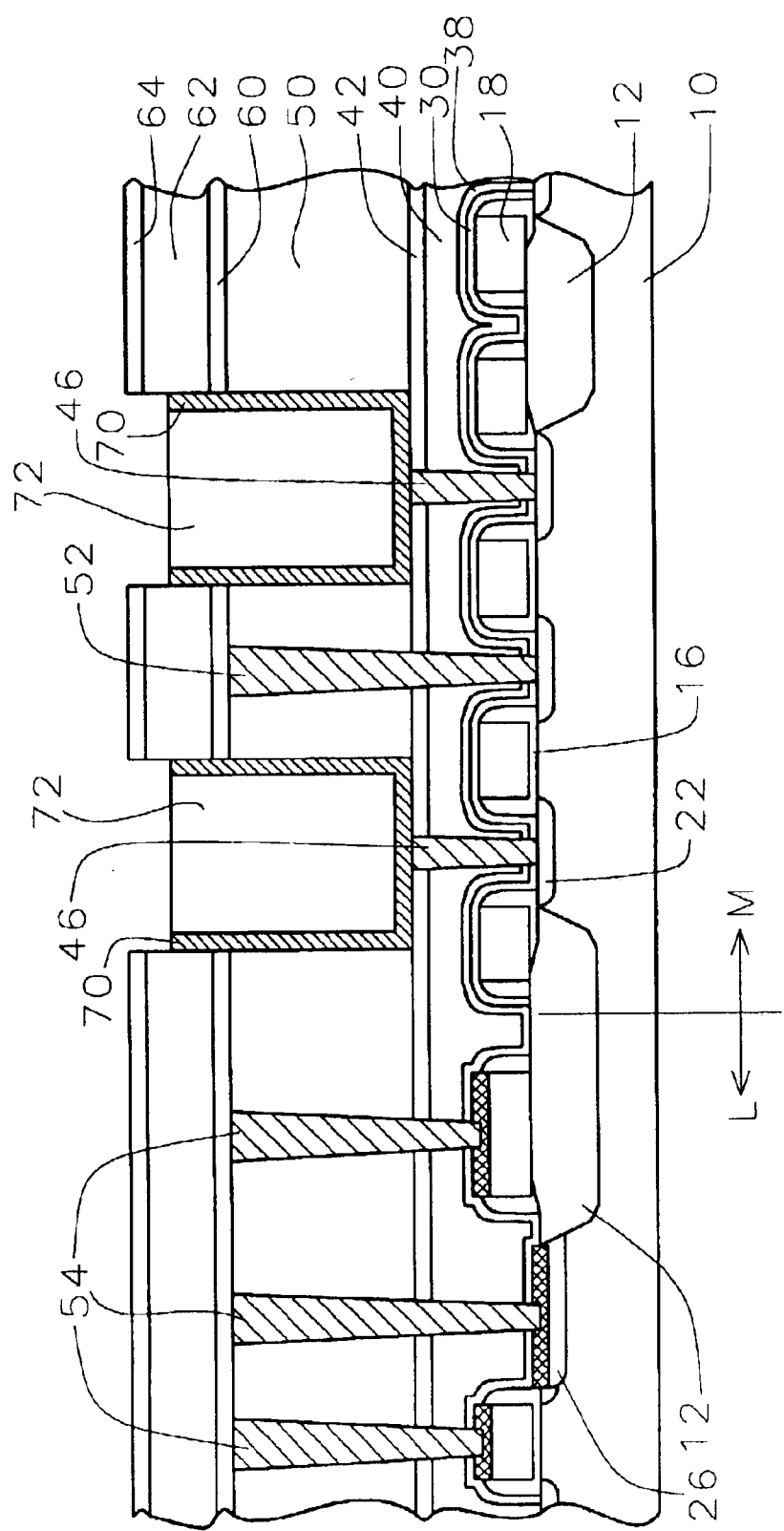

Referring now to FIG. 13, a photoresist layer 72 is coated over the tantalum nitride layer 70 and partially etched back to remove the tantalum nitride layer 70 overlying the SiON layer 64 and to leave the photoresist 72 only within the storage node openings.

Figures 14, 15A, 15B:
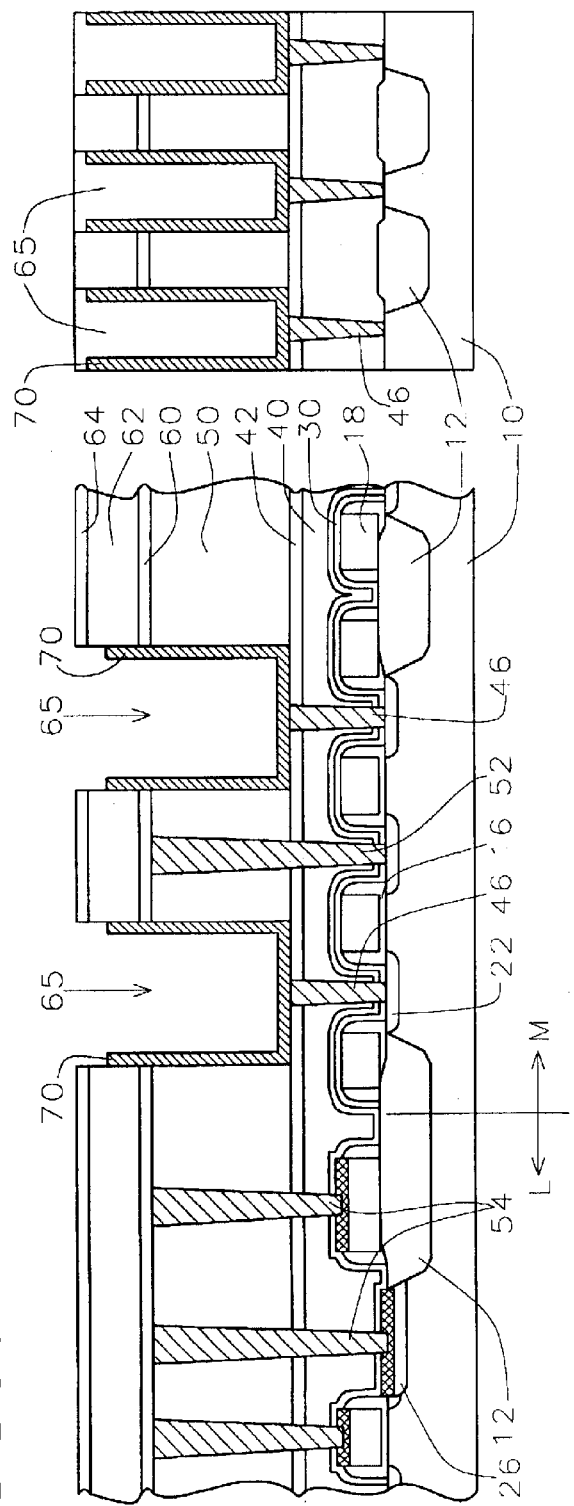

FIG. 14 shows a top view of the capacitor storage node openings 65 after the photoresist 72 and the SiON layer 64 has been stripped. FIG. 15A shows view A—A of FIG. 14. FIG. 15B shows view B—B of FIG. 14.

FIG. 16 again shows a top view while FIG. 17A shows view A—A of FIG. 16 and FIG. 17B shows view B—B of FIG. 16. A second layer of photoresist 76 is coated over the substrate. Now, another key feature of the invention is to be described. A twist line pattern is formed by photolithography techniques. In the twist line pattern, the window between the capacitors and the contact to be formed later is enlarged. This can be seen along line A—A of FIG. 16 where the openings are farther apart than are the openings above and below these in the drawing. In the twist line pattern are two twisted trenches that are mirror images of each other wherein each capacitor in a first of the two twisted trenches is horizontally aligned with a capacitor in a second of the two twisted trenches to form pairs of capacitors wherein the pairs of capacitors are separated from each other horizontally by a first or a second distance wherein the first distance is greater than the second distance.

A twist trench is etched as shown in top view in FIG. 16. This etch etches the tantalum nitride layer 70 and low-k material layer 62 with a stop on the silicon nitride layer 60, as shown in FIG. 17B. A cross-sectional view of the twist trench is shown in FIG. 17A.

FIG. 18 again shows a top view after removal of the photoresist 76. FIG. 19A shows view A—A of FIG. 18 and FIG. 19B shows view B—B of FIG. 18.

Referring now to the top view of FIG. 20 and the cross-sectional views of FIGS. 21A and 21B, a capacitor dielectric layer 80 is deposited conformally within the openings 65 and over the tantalum nitride layer 70. The capacitor dielectric layer 80 may be tantalum oxide or any other high dielectric constant material and have a thickness of between about 100 and 400 Angstroms. A second tantalum nitride or titanium nitride layer 82 is deposited over the capacitor dielectric layer. This layer 82 will form the top electrode of the capacitor. Preferably, an annealing step is performed at between about 450 and 650° C. Now, a copper layer 84 is deposited over the tantalum nitride layer 82 and filling the storage node openings.

As shown in FIGS. 22, 23A, and 23B, the copper is planarized by CMP. This completes the capacitor structure. The copper 84 and the tantalum nitride layer 82 form the top electrode of the capacitors.

Figure 24:
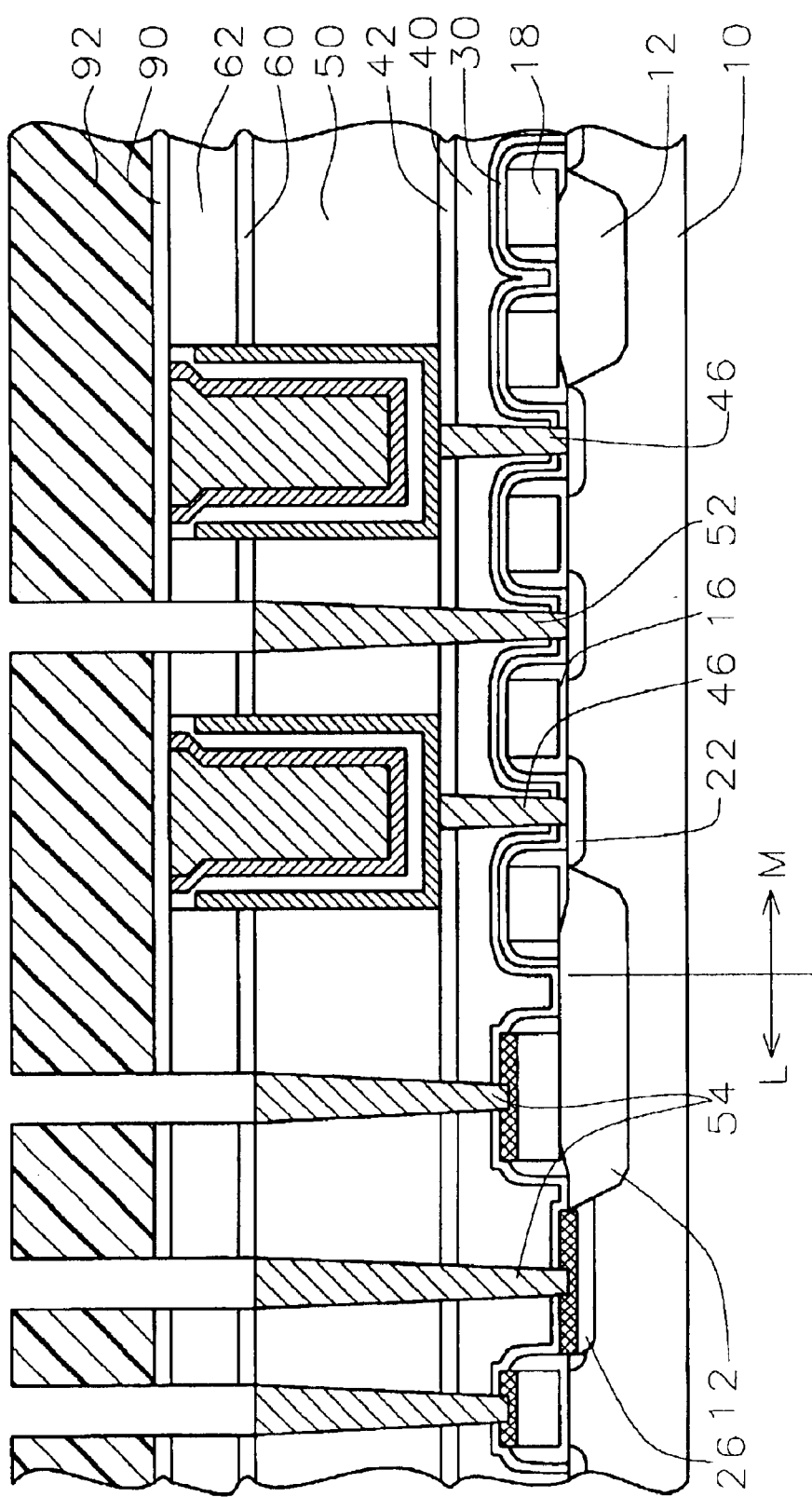

Now a capping layer 90 is deposited over the capacitors as shown in FIG. 24. The capping layer 90 may comprise SiON and have a thickness of between about 200 and 600 Angstroms. A photoresist mask 92 is formed over the substrate and via openings are made to the tungsten plugs 52 and 54. The via opening in the memory area lies between the two twisted trenches and in a horizontal line with one capacitor pair having the first separation distance wherein adjacent capacitor pairs have the second separation distance.

Figure 25:
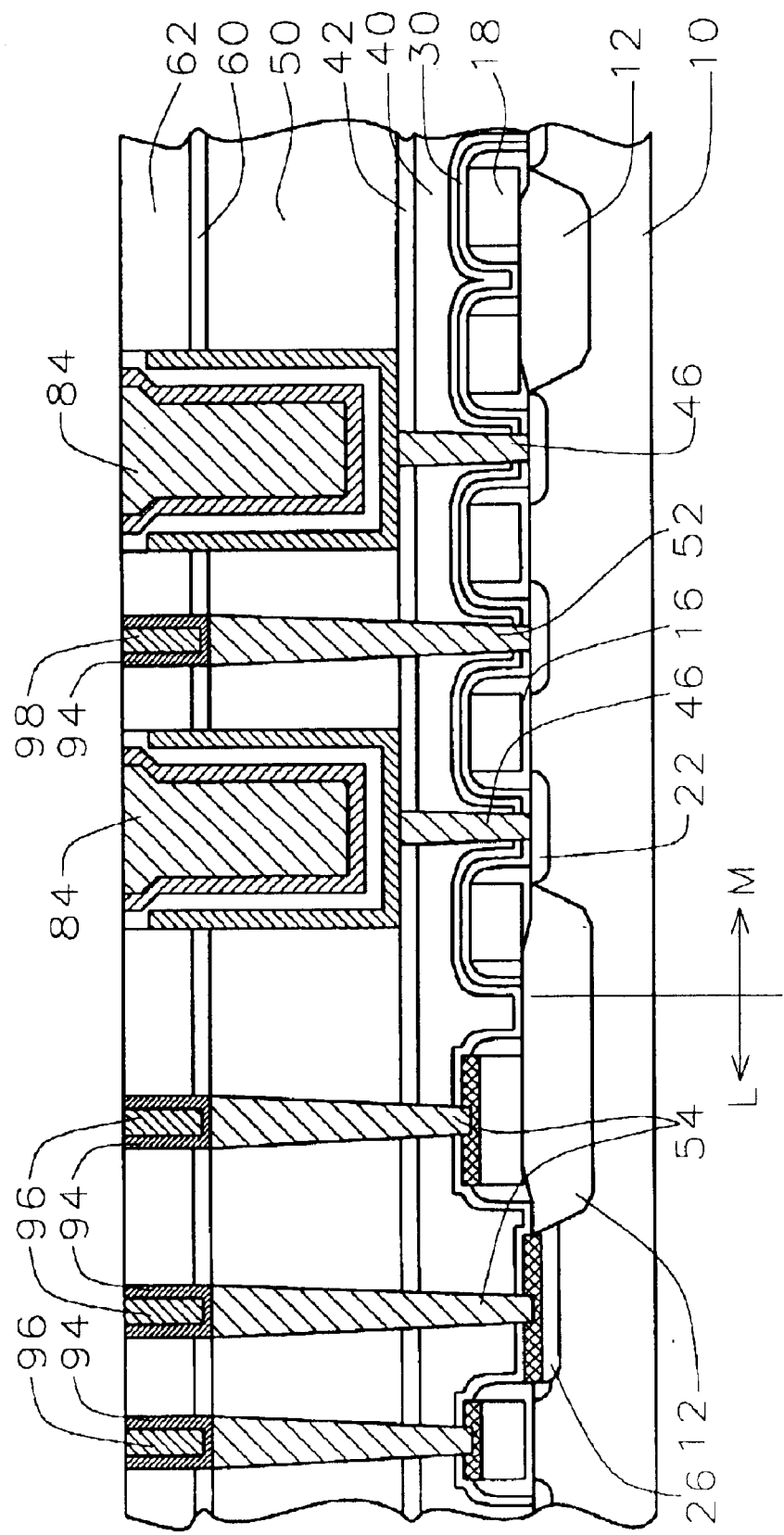

Referring now to FIG. 25, a single damascene process is performed to fill the via openings with a barrier layer such as tantalum nitride 94 and copper layer 96 or 98. CMP planarization completes the first metallization. First line metal contacts 96 are formed in the logic area and bit line contact 98 is formed in the memory area. The bit line will later be formed. The top electrodes 84 shown in FIG. 25 are self-aligned because of the twist line pattern to have an enlarged window between the top electrodes 84 and the bit line contact 98.

FIGS. 26, 27A, and 27B illustrate a second preferred embodiment of the present invention. In this embodiment, after FIG. 19B, the exposed silicon carbide layer 60 is removed. Additional openings are etched through the insulating layer 50 to the stop layer 42. This provides increased capacitor area as shown in FIG. 27B. Processing continues to form the capacitor dielectric layer 80 and the top electrode 82/84 as described in the first embodiment. The view in FIGS. 26 and 27A is the same in both embodiments.

Figure 1:
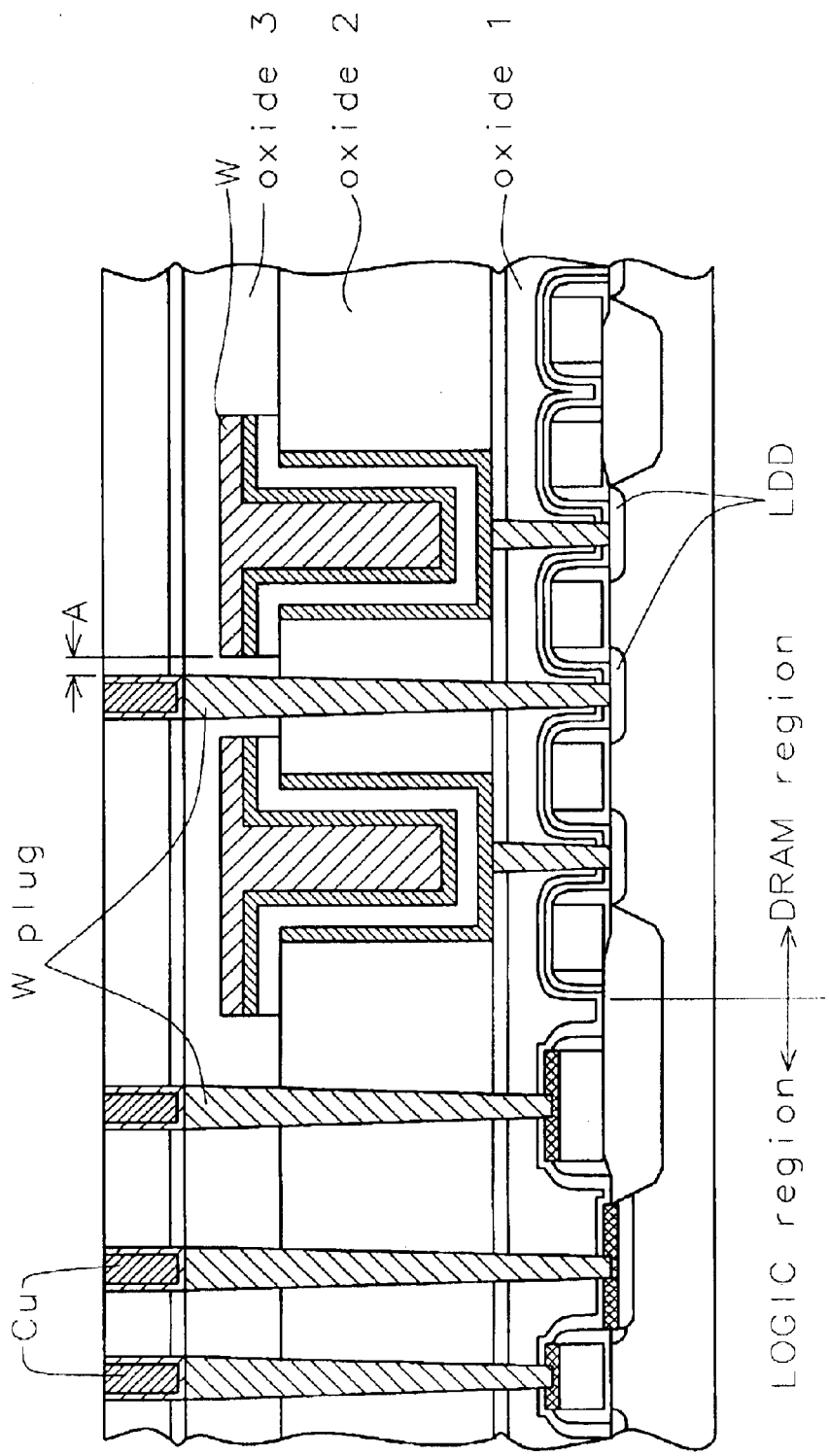
FIG. 1 is a schematic cross-sectional representation of an embedded DRAM device of the prior art.

The process of the present invention provides a method for forming a MIM capacitor in an embedded DRAM process. The following advantages can be seen. A carefully controlled insulating layer thickness will improve the deep contact etch by reducing high aspect ratio of the contact openings. The contact etch depth is decreased by about 20% which is a great improvement for the contact etch. A twist line top plate electrode formed by a self-aligned copper process enlarges the DRAM cell process window between the bit line and the capacitor. Refer to FIG. 1, illustrating a typical capacitor under bitline (CUB) DRAM of the prior art where contacts 110 are opened after formation of the capacitors 100. A narrow process window exists because of the narrow overlay margin A between the top plate electrode and the contact 110. The process of the present invention has a larger process window because of the self-aligned process. As shown in FIG. 27A, the margin B between the top plate electrode and the contact is much larger than in the prior art.

Also, referring to FIGS. 26 and 27A, an improved embedded DRAM and capacitor structure device is described. Trenched capacitors 84 are formed in two twisted trenches (FIG. 26) through an insulating layer in a memory area M of an integrated circuit wherein the two twisted trenches are mirror images of each other and wherein each capacitor in a first of the two twisted trenches is horizontally aligned with a capacitor in a second of the two twisted trenches to form pairs of capacitors wherein the pairs of capacitors are separated from each other horizontally by a first or a second distance wherein the first distance is greater than the second distance. A bit line contact 98 in the memory area M through the insulating layer to a metal plug 52 lies between the two twisted trenches and in a horizontal line with one capacitor pair having the first separation distance wherein adjacent capacitor pairs have the second separation distance. First line metal contacts 96 are formed in a logic area L of the integrated circuit. The bit line contact 98 and the first line metal contacts 96 are no higher vertically than the trenched capacitors 84.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a plurality of capacitors comprising:

providing a plurality of contact plugs through an insulating layer to semiconductor device structures in a substrate wherein said contact plugs are formed in a logic area of said substrate and in a memory area of said substrate and providing a plurality of node contact plugs to node contact regions within said substrate in said memory area; and thereafter fabricating a plurality of capacitors wherein each said capacitor contacts one of said node contact plugs and wherein said capacitors are fabricated in a twist line pattern in a self-aligned copper process.

2. The method according to claim 1 wherein said step of fabricating said plurality of capacitors comprises:

depositing a silicon carbide layer overlying said contact plugs;

depositing a low dielectric constant material layer overlying said silicon carbide layer;

depositing a stop layer overlying said low dielectric constant material layer;

forming a first openings through said stop layer, said low dielectric constant material layer, said silicon carbide layer, and said insulating layer to said node contact plugs;

depositing a first metal layer overlying said stop layer and within said first openings;

filling said first openings with a sacrificial layer;

etching a twisted trench by etching back said sacrificial layer and said first metal layer to leave said first metal layer only within said first openings and recessed from the top of said first openings wherein said first metal layer forms bottom electrodes of said capacitors;

thereafter removing said sacrificial layer;

depositing a capacitor dielectric layer overlying said bottom electrodes;

depositing a second metal layer overlying said capacitor dielectric layer;

depositing a third metal layer overlying said second metal layer and filling said first openings; and polishing back said third metal layer, said second metal layer, and said capacitor dielectric layer to leave these layers only within said first openings wherein said second and third metal layers together form top electrodes of said capacitors.

3. The method according to claim 1 wherein said twist line pattern comprises:

two twisted trenches that are mirror images of each other wherein each capacitor in a first of said two twisted trenches is horizontally aligned with a capacitor in a second of said two twisted trenches to form pairs of capacitors wherein said pairs of capacitors are separated from each other horizontally by a first or a second distance wherein said first distance is greater than said second distance.

4. The method according to claim 1 wherein said semiconductor structures include gate electrodes and associated source and drain regions.

5. The method according to claim 1 wherein said contact plugs comprise tungsten.

6. The method according to claim 2 wherein said first and second metal layers comprise tantalum nitride or titanium nitride.

7. The method according to claim 2 wherein said third and fourth metal layers comprise copper.

8. The method according to claim 2 wherein said sacrificial layer comprises photoresist.

9. The method according to claim 1 after said step of removing said sacrificial layer further comprising:

etching additional openings between said bottom electrodes through said insulating layer to said stop layer to increase capacitor area.

10. The method according to claim 2 wherein said capacitor dielectric layer comprises a high dielectric constant material and has a thickness of between about 100 and 400 Angstroms.

11. The method according to claim 2 wherein said capacitor dielectric layer comprises tantalum oxide ($Ta_2O_5$).

12. The method according to claim 3 further comprising:

etching second openings to said contact plugs in said logic area and in said memory area wherein said second opening in said memory area lies between said two twisted trenches and in a horizontal line with one capacitor pair wherein said one capacitor pair has said first separation distance and adjacent capacitor pairs have said second separation distance; and filling said second openings with a metal layer to complete contacts to said contact plugs in said logic area and in said memory area.

13. A method for fabricating a plurality of capacitors comprising:

providing a plurality of contact plugs through an insulating layer to semiconductor device structures in a substrate wherein said contact plugs are formed in a logic area of said substrate and in a memory area of said substrate and providing a plurality of node contact plugs to node contact regions within said substrate in said memory area;

thereafter fabricating a plurality of capacitors wherein each said capacitor contacts one of said node contract plugs and wherein said capacitors are fabricated in a twist line pattern in a self-aligned copper process comprising:

providing first openings through an insulating layer to said node contact plug;

depositing a first metal layer within said first openings;

forming a twisted trench by etching back said first metal layer to leave said first metal layer only within said first openings and recessed from the top of said first openings wherein said first metal layer forms bottom electrodes of said capacitors;

depositing a capacitor dielectric layer overlying said bottom electrodes;

depositing a second metal layer overlying said capacitor dielectric layer and filling said first openings to form top electrodes of said capacitor;

etching second openings through said insulating layer to said contact plugs; and filling said second openings with a third metal layer to complete contacts to said contact plugs in said logic area and in said memory area.

14. The method according to claim 13 wherein said step of providing first openings through an insulating layer to said node contact plug comprises:

depositing a silicon carbide layer overlying said contact plugs;

depositing a low dielectric constant material layer overlying said silicon carbide layer;

depositing a stop layer overlying said low dielectric constant material layer; and forming first openings through said stop layer, said low dielectric constant material layer, said silicon carbide layer, and said insulating layer to said node contact plug.

15. The method according to claim 13 wherein said semiconductor structures include gate electrodes and associated source and drain regions.

16. The method according to claim 13 wherein said twist line pattern comprises:

two twisted trenches that are mirror images of each other wherein each capacitor in a first of said two twisted trenches is horizontally aligned with a capacitor in a second of said two twisted trenches to form pairs of capacitors wherein said pairs of capacitors are separated from each other horizontally by a first or a second distance wherein said first distance is greater than said second distance.

17. The method according to claim 13 wherein said contact plugs comprise tungsten.

18. The method according to claim 13 wherein said first and second metal layers comprise tantalum nitride.

19. The method according to claim 13 wherein said third and fourth metal layers comprise copper.

20. The method according to claim 13 wherein said sacrificial layer comprises photoresist.

21. The method according to claim 13 after said step of removing said sacrificial layer further comprising:

etching additional openings between said bottom electrodes through said insulating layer to said stop layer to increase capacitor area.

22. The method according to claim 13 wherein said capacitor dielectric layer comprises a high dielectric constant material and has a thickness of between about 100 and 400 Angstroms.

23. The method according to claim 13 wherein said capacitor dielectric layer comprises tantalum oxide ($Ta_2O_5$).

24. The method according to claim 15 wherein in said step of etching second openings to said contact plugs, said second opening in said memory area lies between said two twisted trenches and in a horizontal line with one capacitor pair wherein said one capacitor pair has said first separation distance and adjacent capacitor pairs have said second separation distance.

25. A method for fabricating a plurality of capacitors comprising:

providing a plurality of contact plugs through an insulating layer to semiconductor device structures in a substrate wherein said contact plugs are formed in a logic area of said substrate and in a memory area of said substrate and providing a plurality of node contact plugs to node contact regions within said substrate in said memory area;

thereafter fabricating a plurality of capacitors wherein each said capacitor contacts one of said node contact plugs and wherein said capacitors are fabricated in a twist line pattern in a self-aligned copper process wherein said twist line pattern comprises two twisted trenches that are mirror images of each other wherein each capacitor in a first of said two twisted trenches is horizontally aligned with a capacitor in a second of said two twisted trenches to form pairs of capacitors wherein said pairs of capacitors are separated from each other horizontally by a first or a second distance wherein said first distance is greater than said second distance and wherein said process comprises:

depositing a silicon carbide layer overlying said contact plugs;

depositing a low dielectric constant material layer overlying said silicon carbide layer;

depositing a stop layer overlying said low dielectric constant material layer;

forming first openings through said stop layer, said low dielectric constant material layer, said silicon carbide layer, and said insulating layer to said node contact plug;

depositing a first metal layer overlying said stop layer and within said first openings;

filling said first openings with a sacrificial layer;

etching a twisted trench by etching back said sacrificial layer and said first metal layer to leave said first metal layer only within said first openings and recessed from the top of said first openings wherein said first metal layer forms bottom electrodes of said capacitors;

thereafter removing said sacrificial layer;

depositing a capacitor dielectric layer overlying said bottom electrodes;

depositing a second metal layer overlying said capacitor dielectric layer;

depositing a third metal layer overlying said second metal layer and filling said first openings;

polishing back said third metal layer, said second metal layer, and said capacitor dielectric layer to leave these layers only within said first openings wherein said second and third metal layers together form top electrodes of said capacitors;

etching second openings through said low dielectric constant layer and said silicon carbide layer to said contact plugs in said logic area and in said memory area wherein said second opening in said memory area lies between said two twisted trenches and in a horizontal line with one capacitor pair wherein said one capacitor pair has said first separation distance and adjacent capacitor pairs have said second separation distance; and filling said second openings with a fourth metal layer to complete contacts to said contact plugs in said logic area and in said memory area.

26. The method according to claim 25 wherein said semiconductor structures include gate electrodes and associated source and drain regions.

27. The method according to claim 25 wherein said contact plugs comprise tungsten.

28. The method according to claim 25 wherein said first and second metal layers comprise tantalum nitride.

29. The method according to claim 25 wherein said third and fourth metal layers comprise copper.

30. The method according to claim 25 wherein said sacrificial layer comprises photoresist.

31. The method according to claim 25 wherein said capacitor dielectric layer comprises a high dielectric constant material and has a thickness of between about 100 and 400 Angstroms.

32. The method according to claim 25 wherein said capacitor dielectric layer comprises tantalum oxide ($Ta_2O_5$).

33. An embedded DRAM and capacitor structure device comprising:

trenched capacitors in two twisted trenches through an insulating layer in a memory area of an integrated circuit wherein said two twisted trenches are mirror images of each other and wherein each capacitor in a first of said two twisted trenches is horizontally aligned with a capacitor in a second of said two twisted trenches to form pairs of capacitors wherein said pairs of capacitors are separated from each other horizontally by a first or a second distance wherein said first distance is greater than said second distance;

a bit line contact in said memory area through said insulating layer to a bit line wherein said bit line contact lies between said two twisted trenches and in a horizontal line with one capacitor pair wherein said one capacitor pair has said first separation distance and adjacent capacitor pairs have said second separation distance; and first line metal contacts in a logic area of said integrated circuit;

wherein said bit line contact and said first line metal contacts are no higher vertically than said trenched capacitors.

* * * * *